(12) United States Patent
Maurer

(10) Patent No.: US 6,179,984 B1
(45) Date of Patent: Jan. 30, 2001

(54) CIRCUITRY AND METHOD FOR AN ELECTROPLATING PLANT OR ETCHING PLANT PULSE POWER SUPPLY

(75) Inventor: Manfred Maurer, Heideck (DE)

(73) Assignee: Atotech Deutschland GmbH (DE)

( * ) Notice: Under 35 U.S.C. 154(b), the term of this patent shall be extended for 0 days.

(21) Appl. No.: 09/297,400

(22) PCT Filed: Feb. 2, 1998

(86) PCT No.: PCT/DE98/00383

§ 371 Date: Apr. 29, 1999

§ 102(e) Date: Apr. 29, 1999

(87) PCT Pub. No.: WO98/38357

PCT Pub. Date: Sep. 3, 1998

(30) Foreign Application Priority Data

Feb. 27, 1997 (DE) ............................................. 197 07 905

(51) Int. Cl.⁷ ....................................................... C25D 5/18
(52) U.S. Cl. .................... 205/104; 204/228.1; 204/229.5
(58) Field of Search .......................... 204/224 M, 228.1, 204/229.5, 229.6, 229.7; 205/646, 640, 104

(56) References Cited

U.S. PATENT DOCUMENTS

| | | | |
|---|---|---|---|
| 3,959,088 | * | 5/1976 | Sullivan .............................. 204/14 R |
| 4,656,411 | * | 4/1987 | Carlson .................................. 320/16 |
| 4,839,002 | * | 6/1989 | Pernick et al. ......................... 204/58 |
| 4,863,579 | * | 9/1989 | Asaoka .............................. 204/224 R |
| 4,885,066 | * | 12/1989 | Kuwabara et al. ................ 204/129.3 |
| 4,956,060 | * | 9/1990 | Kuwabara et al. ................ 204/129.2 |
| 5,007,993 | * | 4/1991 | Hull et al. .......................... 204/229.5 |
| 5,078,839 | * | 1/1992 | Kuwabara et al. ................ 204/129.2 |
| 5,143,586 | * | 9/1992 | Ozaki et al. ..................... 204/129.43 |

FOREIGN PATENT DOCUMENTS

| | | |
|---|---|---|
| 36 09 296 | 9/1987 | (DE) . |
| PCT/GB89/ 00042 | 8/1989 | (WO) . |

\* cited by examiner

*Primary Examiner*—Kathryn Gorgos
*Assistant Examiner*—Erica Smith-Hicks
(74) *Attorney, Agent, or Firm*—Paul & Paul

(57) ABSTRACT

The circuit arrangement and method for supplying pulsed current to electrolytic cells according to the invention are used in electroplating systems. To supply current to each electrolytic cell, there are provided two galvanic rectifiers 5, 32 and one change-over switch 12 with respectively two individual switches 23, 24, one output of the rectifiers being connected via a first electric line 33 with the one terminal of the electrolytic cell, the respective other outputs of the rectifiers being connected each via a second electric line 34, 35 with the inputs of the change-over switches, and the output 18 of the change-over switch being connected with the other terminal of the electrolytic cell, a capacitor 20, 21 being respectively connected, in addition, between the first electric line and the second electric lines. Periodic pulse sequences are generated by alternate opening and closing said separate switches.

18 Claims, 5 Drawing Sheets

CIRCUITRY AND METHOD FOR AN ELECTROPLATING PLANT OR ETCHING PLANT PULSE POWER SUPPLY

The invention relates to a circuit arrangement and a method for supplying pulse current to one or more electrolytic cells which are connected in parallel. The method is preferably used for the electroplating of printed circuit boards in vertical dipping systems and in vertical and horizontal feed-through systems.

Electroplating by means of pulse current makes it possible to influence certain properties of the metallic layers which are deposited. In this way, the physical properties of the electroplate layers can be altered within wide limits. In particular, throwing power is improved. In addition, the nature of the surface can be influenced. What is also particularly advantageous is that the resulting electroplating current density and the product quality can be considerably increased. But against the advantages in relation to the product to be electroplated is set the disadvantage of the outlay on equipment for the generation of the pulse current. The systems used for supplying the pulse current come quickly up against physical, technical and economic limits if the electroplating is to be done with current pulses which are brief. As "brief" are to be understood here pulse times in the region of $0.1 \cdot 10^{-3}$ to $10 \cdot 10^{-3}$ seconds. It is in this time range that electroplating by means of pulse current is particularly effective. Where bipolar pulses are used, the article to be treated is polarised alternately cathodically and anodically. If the article for treatment is to be electroplated, the cathodic current/time product (cathodic charge) must be greater than the anodic current/time product (anodic charge).

The advantages of pulsed electroplating can also be used in the electrolytic treatment of printed circuit boards. Vertical and horizontal electroplating systems are used in the manufacture of printed circuit boards. Systems of this kind are generally of very large spatial dimensions. Furthermore, the electroplating currents are large in this case. For this reason, galvanic rectifiers with correspondingly high capacity must be installed in the electroplating system.

Because there is practically always a lack of space, it is often not possible for the galvanic rectifiers with the pulse generators to be positioned very close to the electroplating tanks. This is the opposite of what is required with the application of pulsed technology: with known methods and systems, the distance between the galvanic rectifier and the bath, i.e. the electrolytic cell, must be very short in order to achieve the necessary edge steepness of the pulse currents. With the usual large pulse currents $I_p$ and in the case of low bath resistances $R_{bath}$, the inductance $L_L$ of the conductors between the galvanic rectifier and the electrolytic cell must be kept small. In practice this can only be achieved with very short electric lines. Further measures for reducing the conductor inductance are known, such as for example the transposition of forward and return conductors. This current conductor layout is admittedly possible with cables which have a small conductor cross-section. On the usual conductor rails for high electroplating currents, on the other hand, transposition is impossible. The time constant Tau for the current rise in the bath resistance $R_{bath}$ is calculated according to the formula $$Tau=L_L/R_{bath}.$$

If the distance between the galvanic rectifier with its pulse generator and the bath is only, for example, three metres, with a conductor inductance of, for example, $1 \cdot 10^{-6}$ Henry per metre this would be $6 \cdot 10^{-6}$ Henry for the forward and return conductor.

If a value of $R_{bath}=3 \cdot 10^{-3}$ Ohm is assumed for the bath resistance, this gives, with an admissible disregard of the ohmic conductor resistance, a time constant of $$Tau=L_L/R_{bath}=(6 \cdot 10^{-6} \text{ Henry})/(3 \cdot 10^{-3} \text{ Ohm})=2 \cdot 10^{-3} \text{ seconds}.$$

With an ideal voltage rise in the pulse generator the current in the bath resistance $R_{bath}$ thus rises within $2 \cdot 10^{-3}$ seconds to 63% of the maximum current. The speed of this pulse rise is insufficient for circuit board electroplating, for example. In that case the above-mentioned pulse lengths are worked with. The pulse rise time must be correspondingly shorter.

A horizontal electroplating system for printed circuit boards consists for example of twenty-five anodes connected in parallel on the underside of the circuit board and twenty-five anodes connected in parallel on the upper side of the circuit board. The pulse currents on each side are up to 15,000 amperes. The dimensions of an electroplating system of this kind amount, for example, to six metres in the direction of transport. The current conductors from the galvanic rectifier with its pulse generator to the anodes must be of a corresponding length.

A usual system is shown diagrammatically in FIG. 1:

The circuit boards 1 to be treated are transported through the system in the direction of the arrow, between the upper anodes 2 and the lower anodes 3 of drive elements which are not shown. These anodes can be both soluble and insoluble anodes. In a feed-through system of this kind, each anode forms with its associated cathode (circuit board) and the electrolyte an electrolytic partial cell. By preference, all the upper anodes 2 form together with the upper side of the article to be treated and the electrolyte the upper electrolytic total cell which is supplied with bath current from the galvanic rectifier 5. Correspondingly, the lower anodes 3 form together with the lower side of the article to be treated and the electrolyte the lower electrolytic total cell. Anodes 2, 3 are each electrically connected with a common upper galvanic rectifier 5 and a common lower galvanic rectifier 6 via a switching contact 4. Because of the large size of the rectifier, the distance between the galvanic rectifiers 5, 6 and the electroplating system amounts in practice to at least a few meters. The current conductor 7 to the upper anodes and current conductor 8 to the lower anodes are of a corresponding length. The common current return conductor 9 closes the circuits of the galvanic rectifiers. The article to be treated is connected to electric line 9 by means of electrical contact elements, for example in the form of clamps 10 which are connected with a slip rail 11 so as to slide and be electrically conductive. The switching contacts 4, as a rule electromechanical contactors, serve to switch the anodes individually when the first conductor boards are transported into the feed-through system and to switch off the anodes individually when the last circuit boards are brought out of the feed-through system or when gaps appear between the circuit boards. The function of switching contacts 4 is described in DE-A-39 39 681. Reference is made to this document.

In traditional technology, the necessary high current rise speeds, in conjunction with the high currents in the current conductors from the pulse generator to the bath, cause severe magnetic disturbance fields. The admissible field strengths for work in the surrounding field of such disturbance fields, are laid down in corresponding standards. Safety measures for protecting the personnel who operate the electroplating systems, as described for example in the German standard VDE 0848, also have to be observed. For this reason, screening measures are necessary which involve considerable technical outlay with correspondingly high costs. Where the electroplating currents are very high, even these measures are ineffective.

The described technical and economic problems with electroplating by means of quick pulses represent reasons why so far this pulse technology has not been used in commercial production.

In WO 89/07162 A1, an electrochemical process is described which uses a pulse method. With the reverse pulse method, at least one bath voltage source in the forward direction, i.e. electroplating, and at least one further bath voltage source in the reverse direction, i.e. etching or deplating, is alternately connected to the electrolytic bath. The adjustable voltage sources drive the bath current. With voltage sources, the amplitude and the time response of the current are dependent on the ohmic and inductive resistances of the bath circuit. The voltage change-over and thus at the same time the generation of current pulses in a forward and a reverse direction are realised by means of solid state switches which are in the position of switching the necessary high pulse frequency of up to 5,000 Hertz. In electroplating, the bath current average value in the forward direction, i.e. with cathodic polarisation of the article to be electroplated, must be considerably larger than the bath current average value in the reverse direction, i.e. with anodic polarisation. The proposed switches for generating bipolar current pulses from two voltage sources are not suitable for brief pulses in real electroplating systems. The current conductors from the voltage sources to the voluminous systems are so long that, as a result of the correspondingly high conductor inductance, the pulse rise speeds are substantially greater than the necessary pulse length, especially the reverse pulse length. This is true regardless of the place in the electroplating circuit at which the solid state switches are introduced, i.e. connected in series.

What is also known is that, in switching off a current of an inductive charge, an induction voltage is produced with an amplitude which is dependent on the switch-off speed and the size of the inductance. This voltage is added to the current sourcing voltage. The sum of the voltages is available at the opened switch. Said switch is destroyed unless there are expensive protective measures, especially with the usual high energies which are switched in electroplating systems.

Known extinguishing circuits parallel to the inductance cannot be realised in large electroplating systems. An extinguishing circuit would, in addition, have the disadvantage that the dying away of the current when switched off would be significantly slower. A further disadvantage of the switches proposed proves to be the necessity of installing very expensive protective measures against the strong magnetic fields in the region of the current conductors.

The unavoidable conductor inductance in the bath circuit always has a disadvantageous effect on pulse generation. Even experimentally it was not possible with this technique to achieve pulse rise times with Tau smaller than $2 \cdot 10^{-3}$ seconds. The outlay in order to protect the electronic switches and to protect the personnel against the strong magnetic fields was disproportionately high in this case.

Thus the problem underlying the present invention is to avoid the disadvantages of the known methods and circuit arrangements and especially to indicate a method and a circuit arrangement for supplying pulse current to electrolytic cells, by means of which method pulse currents with a large edge steepness can be generated in large electroplating and etching systems with one or more electrolytic cells, and with which at the same time the generation of electromagnetic fields is limited to a minimum.

The problem is solved by the circuit arrangement according to claim 1 and the methods according to claims 9 and 10. Preferred embodiments of the invention are given in the dependent claims.

In the circuit arrangement according to the invention for supplying pulse current to one or more electrolytic cells which are connected in parallel and have anodes and cathodes, there are associated with each individual electrolytic cell a. at least one galvanic rectifier; and b. at least one change-over switch which may be switched through from at least two inputs to at least one output, or one on/off switch;

c. first electric lines for making a direct electrical connection between respectively one terminal of the rectifiers and the one terminal of the electrolytic cell; and d. second electric lines for making a direct electrical connection between the respective other outputs of the rectifiers and the inputs of the change-over switches or a terminal of the on/off switch being provided; and in addition e. the output or the outputs of said at least one change-over switch or the other terminal of the on/off switch being directly connected with the other terminal of the electrolytic cell; and f. at least one capacitor being connected between the first electric line and each second electric line.

With corresponding control of the change-over switches for the periodic closing and opening of the connections between the rectifiers and the electrolytic cell via the second electric lines, the following process steps are carried out with this circuit arrangement during electroplating or etching, particularly deplating:

A. In a first time interval $t_1$ (for example in order to generate a cathodic current pulse on the article to be treated ($t_k$)):

a. by connecting a first rectifier with the electrolytic cell, said cell is fed via a second electric line and at least one change-over switch; and b. simultaneously the capacitor or capacitors which are connected to the first rectifier via one of the second electric lines are partially discharged;

c. the capacitors, which are connected with the other rectifiers via the remaining second electric lines are charged.

B. In a second time interval $t_2$ (for example to generate an anodic current pulse on the article that is to be treated ($t_a$)):

d. by connecting a second rectifier with the electrolytic cell, said cell is fed via a second electric line and at least one change-over switch; and e. simultaneously the capacitor or capacitors which are connected with the second rectifier via another of the second electric lines are partially discharged;

f. the capacitors which are connected with the remaining rectifiers via the remaining second electric lines are charged.

In order to avoid the switches or other components being destroyed, a plurality of rectifiers should not be connected with the electrolytic cell via the switches at the same time. For this reason, the known method "break before make" is applied, according to which the connection between the electrolytic cell and a rectifier is interrupted by a switch before a new connection is made between the cell and some other rectifier. In this way the galvanic rectifiers do not short-circuit one another.

With the use of on/off switches the following method steps are carried out:

A. In a first time interval $t_1$ (for example for generating a cathodic current pulse on the article to be treated ($t_k$)):
   a. by connecting the rectifier or rectifiers with the electrolytic cell, the electrolytic cell is fed via the second electric line and the on/off switch; and
   b. the capacitors are simultaneously partially discharged.

B. In a second time interval $t_2$ (for example to generate an anodic current pulse on the article to be treated ($t_a$)):
   c. the connection between the electrolytic cell and the rectifier or rectifiers is interrupted by the on/off switch; and
   d. the capacitors are charged.

Through constant repetition of these process steps a-b-c-d-e-f or a-b-c-d, a periodic current pulse sequence is generated in the electrolytic cell. Bipolar pulse current is characterised by a sequence of positive and negative current pulses. For certain applications, however, unipolar current pulse sequences which only have cathodic or only anodic current pulses can also be generated which, for example, respectively have different peak current values.

An arrangement which is formed by at least one cathode and one anode, as well as the electrolyte liquid situated between these two electrodes, can be regarded as an electrolytic cell. Thus, in the manufacture of printed circuit boards, on the one hand one side of a circuit board and the anode opposing the same can, together with the respective electrolyte, be seen as an electrolytic cell, and on the other hand the other side of the printed circuit board and the other anode facing same, together with the respective electrolytes, can be seen as another electrolytic cell.

Preferably, both the change-over switches and the on/off switches and the capacitors are so arranged in relation to the electrolytic cell that the inductance of the current conductors connecting the electrolytic cell and the switches is minimised. For example, the switches and the capacitors are arranged in close proximity to the electrolytic cell by keeping this current conductor as short as possible. In addition, usual methods for optimising the wiring arrangement can be exploited in order to keep the conductor inductances to a minimum.

In a preferred embodiment, two rectifiers are provided with which a plurality of electrolytic cells, connected in parallel can together be supplied with current, in each case a plurality of circuits having common capacitors for supplying the electrolytic cells. These circuits are preferably respectively allocated to one rectifier. This means that a group of several electrolytic cells is connected via the change-over switch with only one capacitor and this capacitor in turn is connected with one rectifier. Another group of electrolytic cells is connected via the change-over switch or on/off switch with another capacitor and the latter with another rectifier.

The group of electrolytic cells arranged on one side of circuit boards moved on a conveying path and consisting of circuit board surfaces facing this side, the anodes arranged on this side and the solution of electrolytes located between these electrodes, can be connected as a group of electrolytic cells being associated with a capacitor. The other group of electrolytic cells, which is associated with another capacitor, is formed by the group of electrolytic cells situated on the other side of the conveying path.

In order to produce a low-maintenance circuit arrangement and high pulse frequencies, for example of up to 1,000 Hertz, electronic switches can be provided to generate the pulse sequence. In principle, mechanical switches are also possible. In that case, rotary switches and double-throw switches can be used for the switches as well as circuits with a plurality of separate switches which are connected to one another in parallel and actuated alternately.

The change-over or off/on switches can respectively be equipped with a current sensor in order to control exactly the current intensity lecels in the electrolytic cells. The measuring signals which can be detected with these sensors are also evaluated for excess current disconnection to protect the switches.

The circuit arrangement according to the invention can, moreover, be integrated into an electroplating or etching system in such a way that the measuring signals of each current sensor can be transmitted to an higher-level control which is contained in the electroplating and etching system and provided to monitor and regulate same.

The change-over switches and on/off switches are preferably triggered by means of electric control signals.

The amplitudes of the pulse currents flowing through the electrolytic cell are preferably set at the given ratio of $t_1$ (for example $t_k$: cathodic current pulse in the first time interval) to $t_2$ (for example $t_a$ in the second time interval) through the adjustment of the cathodic rectifier current $I_k$ for the cathodic amplitude and of the anodic rectifier current $I_a$ for the anodic amplitude.

Moreover, by measuring the amplitude values of the pulsed bath currents flowing through the electrolytic cells and comparing these values with desired values, the current amplitudes in the electrolytic cells can also be controlled to constant values by adjusting the rectifier current.

Additionally, further time intervals can also be introduced into the method sequence a-b-c-d-e-f or a-b-c-d, for example time segments in which no current flows through the electrolytic cells, e.g. when the article to be treated is being taken in or out of the electrolyte solution. The change-over switches are, to this end, so controlled that between time intervals $t_1$ and $t_2$ within a time interval $t_{zero}>0$ all connections between the rectifiers and the electrolytic cell are interrupted.

By the change-over switch or the on/off switch being triggered in a special way, certain method sequences can be realised. Moreover, the switching positions respectively provided for the desired current direction of a change-over switch for supplying the electrolytic cell with direct current can be kept connected whilst no current supply occurs via the respective other positions of the switch by the time intervals $t_1$ or $t_2$ on at least a portion of the electrolytic cells being set to such a size that the bath current acts as direct current. The same applies with the use of on/off switches.

If a plurality of electrolytic cells are contained in an electroplating or etching system, said cells can be applied on in cycles with periodic current pulse sequences. In a further form of embodiment, a plurality of groups of electrolytic cells can also be contained in the system, which are connected within a group respectively parallel to one another. By preference in one group of these electrolytic cells a first periodic current pulse sequence can be generated and in another group of electrolytic cells a second periodic current pulse sequence can be generated with a phase shift in relation to the first pulse sequence. For example, in a system for plating printed circuit boards, the electrolytic cells which are located on the one side of the printed circuit boards and the cells which are located on the other side can respectively form different groups of cells. In that case the electrolytic pulse currents are led to the individual sides of the printed circuit boards with phase shift. For example, at any given time the front sides of the printed circuit boards can be polarised cathodically and the rear sides simultaneously anodically. At a later point in time the polarity is then reversed.

In a further mode of operation, with for example separate circuits for the supply of the front and the rear sides of printed circuit boards, at least a portion of the electrolytic cells can be supplied by permanent interruption of the respective connections between the rectifier and the electrolytic cell, whilst a pulse current is led through the circuits of other electrolytic cells.

In order to avoid the separate switches being destroyed when they are opened, diodes can, in addition, be connected parallel to the separate switches and be of such polarity that when the separate switches are opened the energy which is produced is taken up by the capacitors without any danger of destroying the separate switches.

BRIEF DESCRIPTION OF DRAWINGS

The invention is described in greater detail below with the aid of FIGS. 2 to 5. The figures show FIG. 1 a diagrammatic view of the electrolytic partial cells in a horizontal feed-through system according to the state of the art.

The invention is shown by way of example in a horizontal feed-through system for electroplating printed circuit boards. The circuit arrangement according to the invention and the method can also be used in a corresponding fashion for etching printed circuit boards and for electroplating other articles. Moreover, the circuit and the method can also be used in vertical systems, for example in dipping systems or in systems in which the article to be treated is handled in a feed-through system in vertical orientation.

Figure 2:
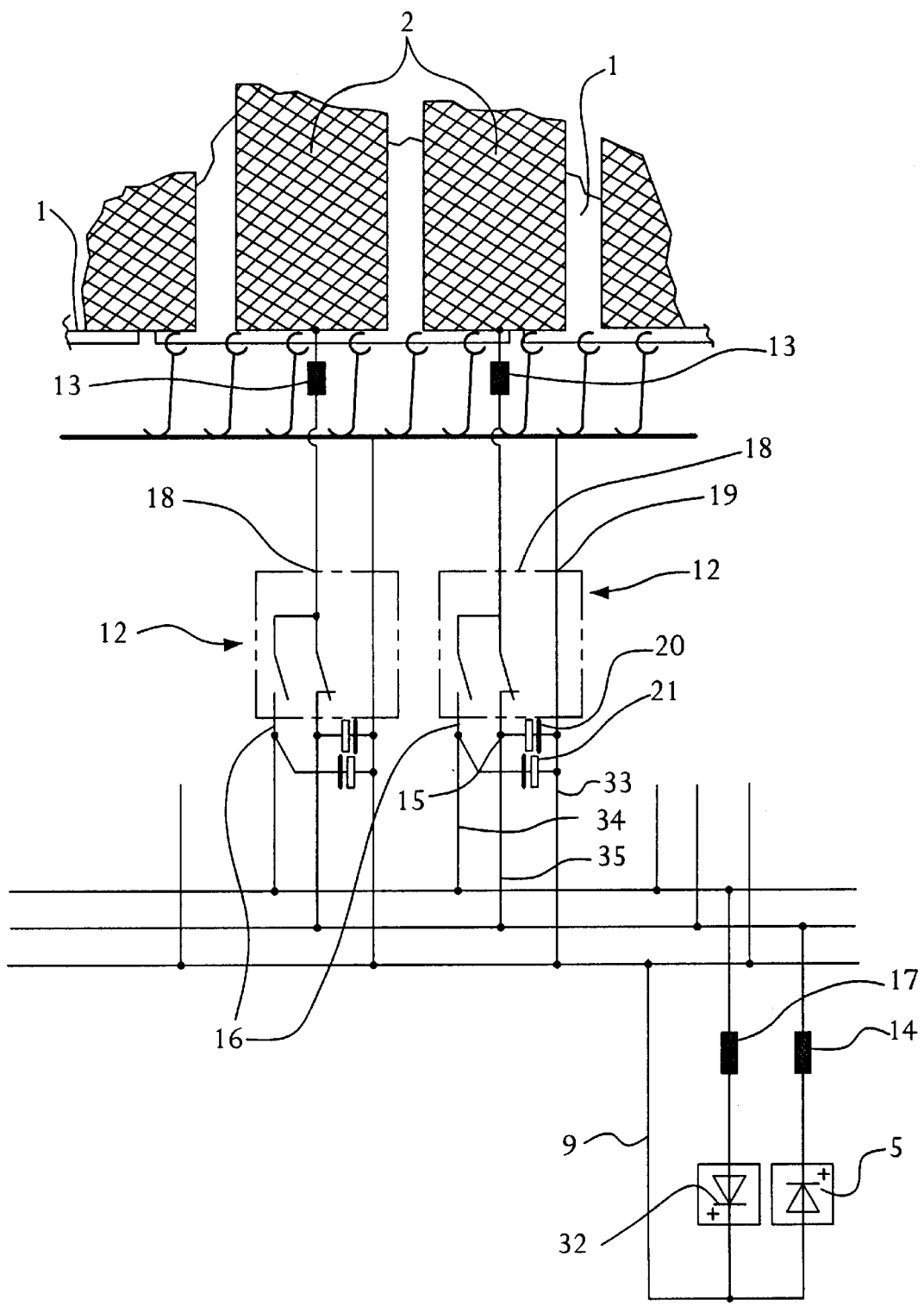
FIG. 2 the circuit arrangement according to the invention.

In FIG. 2 a system according to the invention is reproduced. Two upper anodes 2 and the article to be treated 1 are shown in detail. In the electrical terminal of the anodes 2, change-over switches 12 for bipolar pulse operation are inserted. The change-over switches 12 are arranged in proximity to the anodes. The current conductor layout is chosen to be such that the current conductor partial inductance 13 from the output 18 of the change-over switch 12 to the electrolytic cell is very small. On the other hand, the current conductor partial inductance 14, 17 of the galvanic rectifiers 5, 32 to the inputs 15, 16 of the change-over switch 12 can be of any great size.

Below, the statement of the electroplating phase always relates to the article to be treated 1. Accordingly, in the cathodic electroplating phase the article to be treated is polarised negatively and the anodes positively. The anodic etching or depleting phase is fed from the galvanic rectifier 32 via the current conductor partial inductance 17. The associated change-over switch input has the reference number 16.

In the current conductor partial inductances 14 or 17, all the effective inductances of the circuits of the galvanic rectifiers 5, 32 to the inputs of the change-over switches 12, i.e. in the first electric lines 34, 35 and the second electric line 33, are combined. In the current conductor partial inductance 13, all effective inductances of the circuit from the output 18 of the change-over switch 12 to the electrolytic cell and back to the change-over switch at the conductor terminal 19 are combined. The current conductor partial inductance 13 is kept small by a spatially very close arrangement of the change-over switch 12 to the electrolytic cell. Further known measures for reducing the conductor inductance are possible. Thus a low time constant Tau for the pulse current rise according to the formula (L: Inductance, R: Resistance)

$$Tau=L/R$$

is achieved.

The spatial proximity of the change-over switches to the electrolytic cell is also possible with the large dimensions of the electroplating system through its division into electrolytic partial cells. The arrangement of the change-over switches 12 close to the respective electrolytic partial cells has the consequence that the large galvanic rectifiers 5, 32 can be arranged centrally and at a greater distance from the change-over switches 12. However this has no influence on the speed of the pulse rise. The same is true for the galvanic rectifiers which supply pulse current to the lower side of the article which is to be treated.

The galvanic rectifiers 5, 32 are capacitive loaded by capacitors 20, 21. For each pulse polarity, a capacitor of great capacity is provided. Capacitor 20 serves as an energy store for the cathodic pulse current. Capacitor 21 stores the energy of the anodic pulse current. In practice, these capacitors 20, 21 are a plurality of capacitors with a corresponding lower capacity which are connected in parallel. The capacitive loads are charged with direct current from the galvanic rectifiers 5, 32 via the conductors and thus also via the conductor partial inductances 14, 17.

For the direct current the size of the inductance which occurs in practice is of no significance if insignificant switching on and off effects are ignored. Because galvanic rectifiers are switched on and off slowly, the conductor inductances 14, 17 here also have no influence on the electroplating or etching or depleting process. Slow switching means that the galvanic rectifiers are driven up high on a current ramp or driven back.

The direct current in the conductors 33, 34, 35 offers the advantage that in this region practically only magnetic d.c. fields occur which represent no danger to the operators. Magnetic alternating fields only occur at the change-over switch or on/off switch and on the short conductors to the electrolytic cell. High speeds of current change and small electroplating or etching voltages cause substantially magnetic disturbance fields. Because of the division of the electroplating current into partial currents per anode, the absolute value of the pulse current in each electrolytic partial cell is substantially lower than the total current. The magnetic disturbance fields are also correspondingly low.

Figure 3:
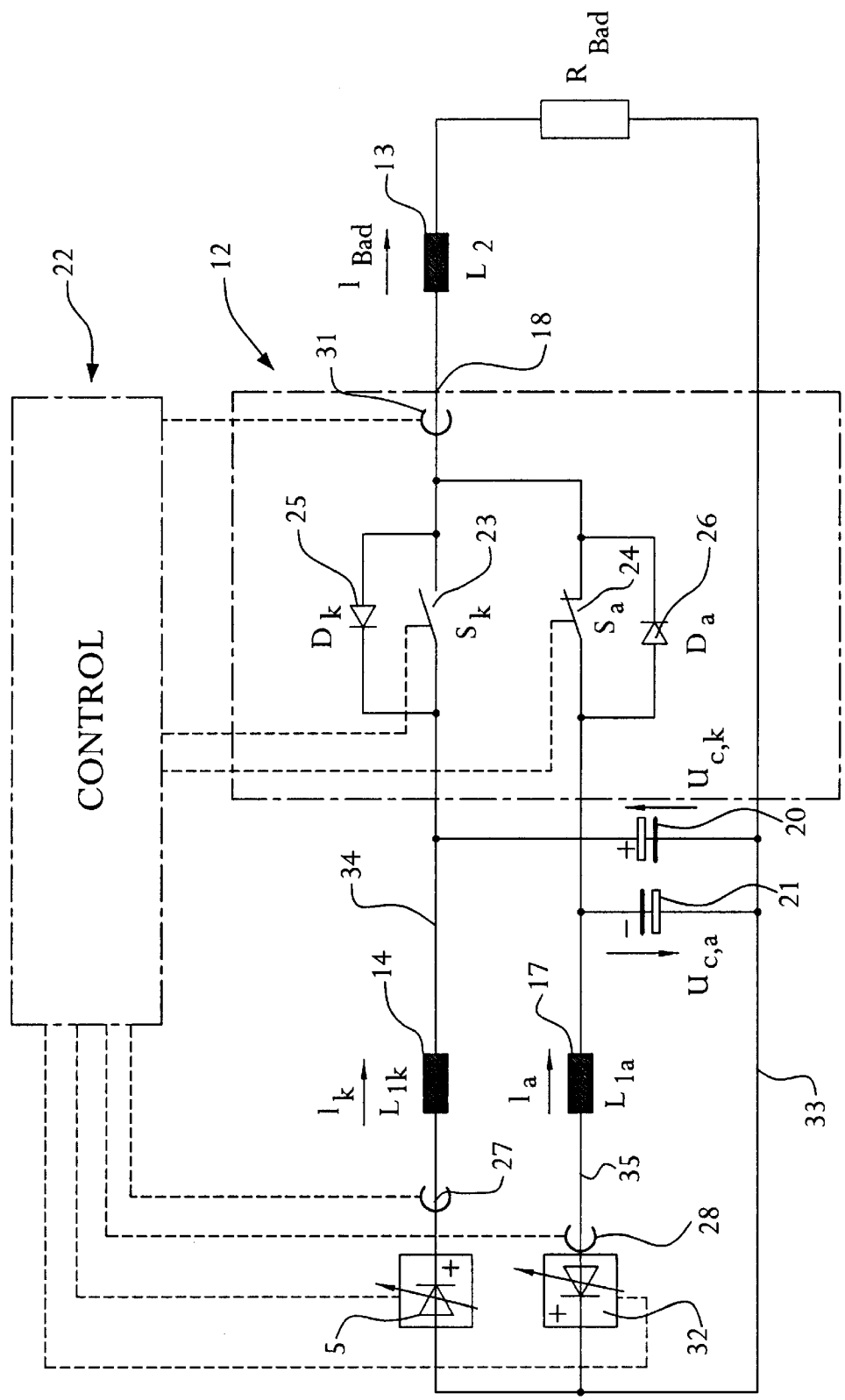
FIG. 3 an electrical equivalent circuit diagram of the circuit arrangement according to the invention.

In the equivalent circuit diagram of FIG. 3, the change-over switch 12 and the overriding control system 22 are combined respectively with dot-dash lines. The control system 22 provides for the punctual switching of switches 23, 24 as well as of adjusting the pulse amplitudes by having an effect on the rectifier output currents corresponding to predetermined desired values. As switching elements, electro-mechanical contacts are shown symbolically. In practice, however, electronic switches are used preferably. For example, MOSFET transistors or IGBTs (isolated gate bipolar transistors) are suitable.

Switch 23 connects, for the duration of the first pulse, the voltage of the charged capacitor 20 to the electrolytic partial cell, which is here represented as the compensating resistance $R_{bath}$. Switch 24 connects, for the duration of the second phase, the voltage of the loaded capacitor 21 to the electrolytic cell. The voltages drive the current $I_{bath}$ via the conductor partial inductance 13 into the compensating resistance $R_{bath}$. Because the inductance 13 is very small as a result of the measures described, the required high current rise times required in printed circuit board technology are achieved. For example for $L_2=2\cdot10^{-6}$ H and with a resistance of the electrolytic partial cell of $R_{bath}=20\cdot10^{-3}$ Ohm, the time constant for the current rise amounts to 63% of the maximum value Tau=$0.1\cdot10^{-3}$ seconds.

Figure 4:
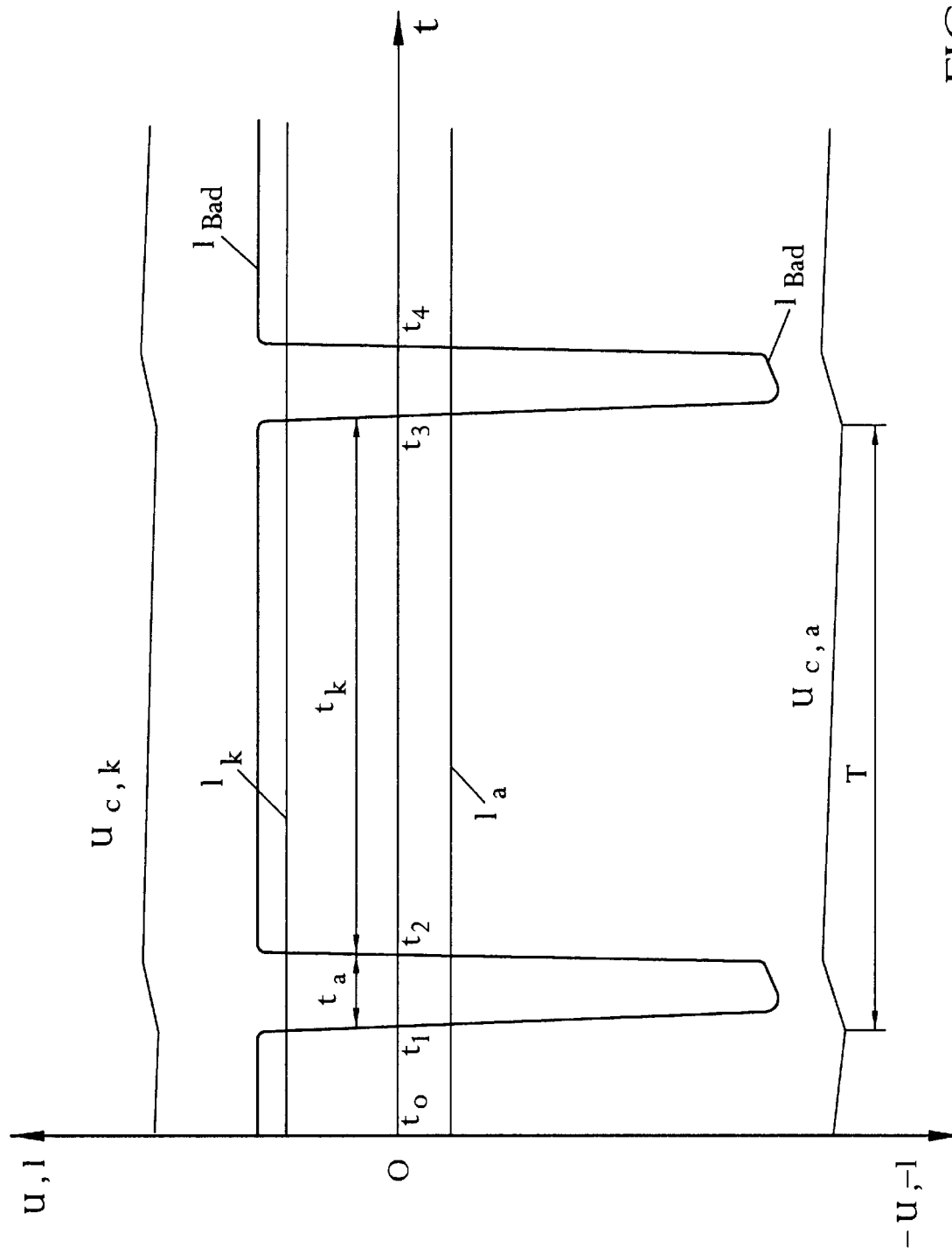
FIG. 4 time course of the currents and voltages during bipolar pulse current supply with a current-controlled galvanic rectifier.
Figure 5:
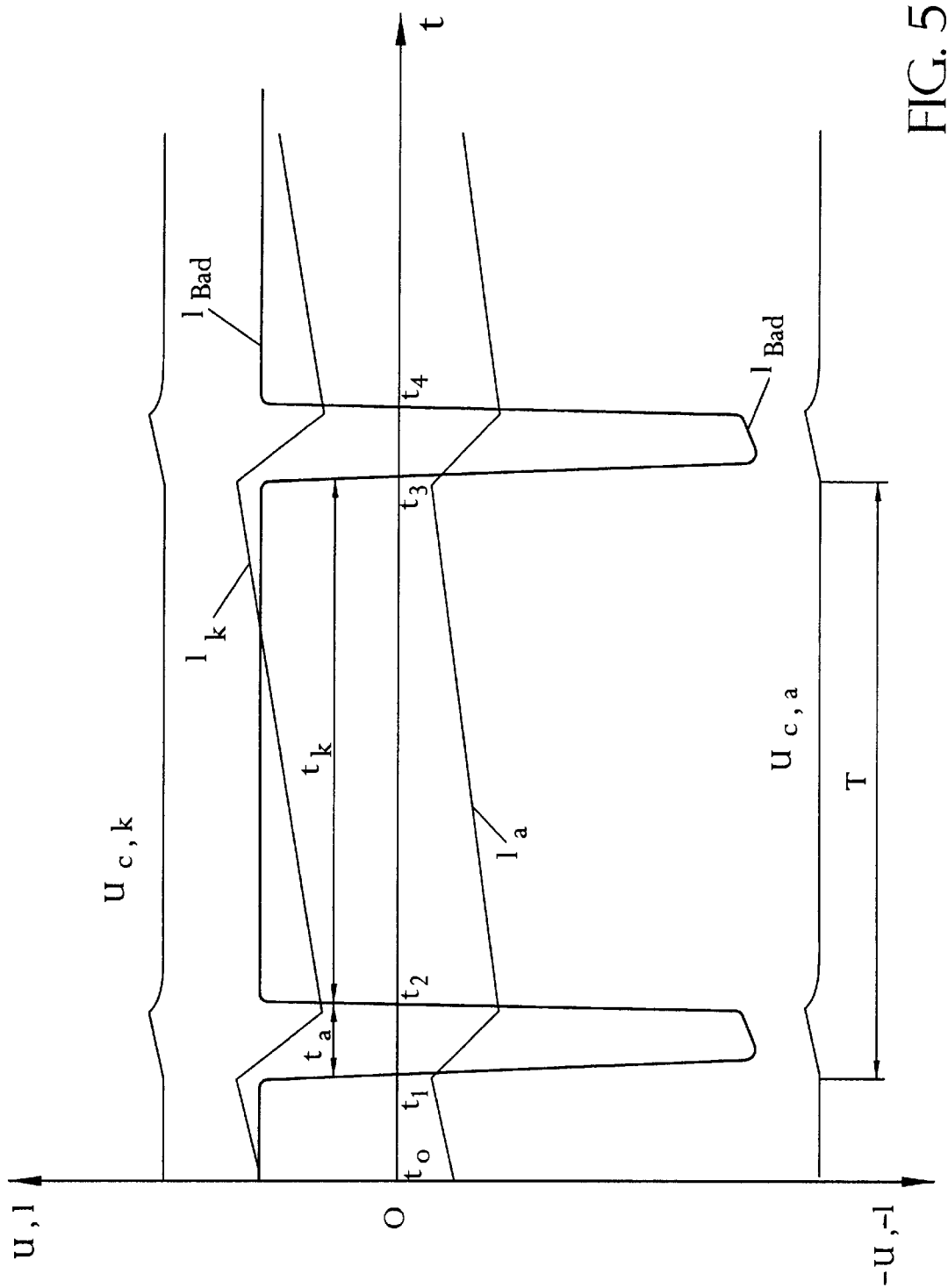
FIG. 5 time course of currents and voltages during bipolar pulse current supply with a voltage-controlled galvanic rectifier.

A higher-level control system 22 synchronises the time sequences. In this system, the times for the alternate closing of switches 23, 24 are laid down as desired values, the same is true also for the generally differing pulse amplitudes for the cathodic and for the anodic pulse time. Thus, the energy required for the electrolytic treatment is known per polarity. This is at the same time the desired value for the direct current of the corresponding galvanic rectifier. In terms of control technology, this current can be set in the galvanic rectifiers as an arithmetic mean value of the current and kept constant. The current can be kept directly constant in this way by means of a current-controlled galvanic rectifier. The currents of the galvanic rectifiers 5, 32 are measured with current sensors 27, 28 such as shunts for example. The time courses of the current and the voltage of the current-regulated galvanic rectifiers are shown in FIG. 4. The arithmetical mean current value can be kept constant by control technology also through setting the galvanic rectifier output voltage by adjusting the current mean value. The resulting time courses of the current and voltage are shown in FIG. 5.

The terminal voltage of the galvanic rectifiers adjusts itself or is adjusted in such a way that the approximately constant capacitor voltage $U_C$ drives the pulse current at the required amplitude. A state of equilibrium is established between the direct current energy emitted by the galvanic rectifier and defined according to the desired value and the energy in pulse form released by the capacitor 20, 21 to the bath resistance $R_{bath}$. Both current mean values are the same size. With increasing pulse amplitude, the capacitor voltage $U_C$ rises. The maximum possible voltage is determined by the nominal voltage of the respective galvanic rectifier.

In FIG. 4, the currents and voltages of a bipolar pulse bath current supply are shown. The periodic pulses have a cycle time T. The cathodic time interval $t_k$ alternates with the anodic time interval $t_a$.

The formula $$T = t_k + t_a$$

applies. The ratio of the two time intervals $t_k$ to $t_a$ is referred to as the keying ratio. The current average value $I_{average,k}$ of the cathodic pulses is calculated from the keying ratio and the peak current values $\hat{I}_k$ (peak current value of the cathodic current pulse) and $\hat{I}_a$ (peak current value of the anodic current pulse) according to the formula $$I_{average,k} = (\hat{I}_k \cdot t_k)/(t_k + t_a)$$

Correspondingly the current average value $I_{average,a}$ for the anodic pulses is calculated from $$I_{average,a} = (\hat{I}_a \cdot t_a)/(t_a + t_k).$$

The current average values are the output direct currents of the galvanic rectifiers. In the time point $t_0$ the currents $I_k$ and $I_a$ flow in steady state from the two galvanic rectifiers 5, 13 (FIGS. 2, 3). The current $I_k$ flows via the momentarily closed switch 23 to load $R_{bath}$. In addition, the charged capacitor 20 feeds current via the load $R_{bath}$. Here, the capacitor voltage $U_{c,k}$ is slightly reduced. The current of the galvanic rectifier 32 flows into the capacitor 21. On the other hand, the capacitor voltage $U_{c,a}$ rises with corresponding polarity. In the time $t_1$ the switch 23 opens and immediately then the switch 24 closes. The current $I_k$ of the galvanic rectifier 5 continues to flow at full level into the capacitor 20 to be precise. Its voltage $U_{c,k}$ rises accordingly. In the time $t_1$ the current $I_a$ of the galvanic rectifier 32 continues to flow at full level, via switch 24 into load $R_{bath}$. The additional momentary energy required is supplied by the charged capacitor 21. The capacitor voltage $U_{c,a}$ decreases with increasing discharge. In time period $t_2$ the switch 24 opens and immediately thereafter switch 23 is closed again. Then, the sequence is repeated to time $t_0$ (as described above).

In the time interval from $t_1$ to $t_2$, the capacitor 21 acts as a substantial energy source for the electrolytic cell. The capacity has to be chosen correspondingly high if the pulse tilt is to be kept small. Hence, the capacitors 20, 21 in the steady state are always to be charged or discharged only partially.

In FIG. 4 is shown that it is substantially the voltages which react to the pulse loads where the direct current of the galvanic rectifiers is constant. In FIG. 5 is shown that, where the initial voltage of the galvanic rectifiers is practically constant, it is essentially the currents which react to the pulse loads. The current ripple to be considered here does not have any steep current edges. It only occurs between the galvanic rectifier output and the change-over switch input. The pulse current in the electrolytic cell is the same in both cases. Through the temporary storage of energy in the capacitors 20, 21, what is also achieved is that the galvanic rectifiers emit a direct current and are not exposed to any pulse load. Disturbances due to the pulses do not occur.

Figure 1:
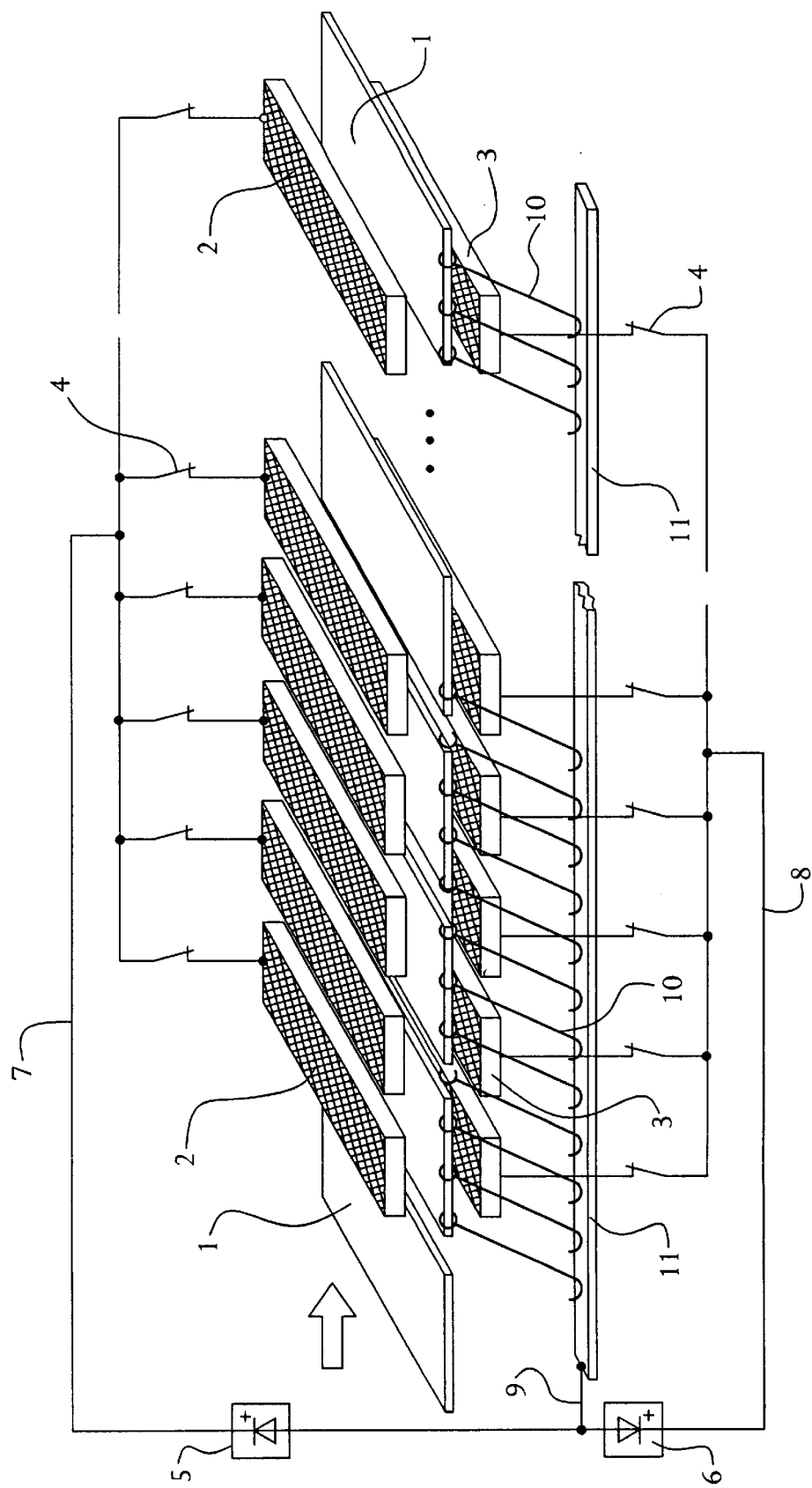

In contrast to the known arrangement (FIG. 1) described above, in which the circuit arrangement according to the invention is used, a further advantage proves to be the fact that with a direct current having a certain amplitude, i.e. a specific peak current value, a multiple peak pulse value can be generated. The factor is dependent on the keying ratio. In practice it is about 10. This means that for example for an electrolytic partial cell with 50 amperes direct current, a peak pulse value of 500 amperes is generated backwards. In an experimental feed-through system having a length of 3 meters for electroplating printed circuit boards, for example the following times and amplitudes were used:

$t_a = 1\cdot10^{-3}$ seconds;
$t_k = 15\cdot10^{-3}$ seconds;
The peak current values were $\hat{I}_a = 4\cdot\hat{I}_k$;
The peak currents of each electrolytic cell were $\hat{I}_a = 800$ A and $\hat{I}_k = 200$ A;
The capacity of the capacitors 20, 21 amounted to 0.5 Farad, respectively.

Referring back to FIG. 3, a bipolar acting current sensor 31 is inserted at the switch output 18 of the change-over switch 12. The sensor serves to monitor overcurrent, i.e. to protect the change-over switch against destruction. With this current sensor, the peak values of the pulse currents can be measured. Thus, the currents of the galvanic rectifiers 5, 32 can also be directly controlled. The peak values are compared in the higher-level control with the peak desired values. The controller output adjusts the current of the galvanic rectifiers 5, 32 in such a way that the pulse current peak values are automatically kept constantly at their desired value.

When switching the load being some inductive as a result of the current conductor inductance 13, overvoltages occur during the cut-off moment. These overvoltages can destroy the electronic switches. Protective diodes 25 and 26 with the polarity shown prevent a too high voltage rise across each switch. The induction voltages drive a current via the diode of the switch which was open during the cut-off moment. The current flows into capacitor 20 or into capacitor 21. It reduces the excess voltage usefully and immediately. The diodes 25, 26 can represent integrated diodes in the semiconductor components.

In addition to this, an electronic locking device in the change-over switch 12 ensures that switches 23, 24 cannot close at the same time. The distance of time between opening the one separate switch and closing the other switch can also be increased such that during this time no current flows being effective for electroplating. If spatial conditions allow, the capacitors 20, 21 can also be allocated to a plurality of change-over switches and electrolytic cells acting in parallel. The same is true for the capacitors 20, 21 including switches 23, 24. What is decisive is that the spatial distance between the capacitors and switches and the electrolytic cell or cells is small.

For electroplating by means of pulsed current, it is very important to keep to the amplitude and the times of the pulses. The required properties of the deposited electroplation layers can only be maintained in this manner. What is problematic in practice is measuring the pulse amplitude with simple means in such a way that a control loop for the necessary current density can be constructed. The method according to the invention makes it possible to determine the pulse amplitudes in a surprisingly simple way. The constant current $I_{average}$ of the galvanic rectifiers, which is simple to measure and to regulate, is a measure for the pulse energy. Where the keying ratio is known, the peak value $\hat{I}$ of the pulses can be calculated using $I_{average}$ according to the formula $$\hat{I} = I_{average} \cdot (t_{pulse} + t_{pause})/t_{pulse}$$

Here $t_{pulse}$ is the time interval in which a current pulse is generated and $t_{pause}$ is the time interval in which no current pulse is generated. In the case of a change-over switch, $t_{pause}$ such as for cathodic current pulses indicates the time interval in which no cathodic current pulses are generated.

In the electroplating system, the upper anodes 2 and the lower anodes 3 are charged with pulse currents of the same frequency. Both pulse sequences can run synchronously. They can, however, also be offset in phase to one another. The bipolar change-over switches also make it possible, if necessary, to operate the electroplating or etching system with direct current. In cathodic operation, i.e. during electroplating, switch 23 is permanently closed. With direct current etching, switch 24 is permanently closed. The switch of the opposite polarity is correspondingly permanently open in each case.

All the disclosed features as well as combinations of the disclosed features are the subject-matter of this invention, insofar as they are not expressly referred to as known.

List of Reference Numbers
1 article to be treated—printed circuit board
2 upper anode
3 lower anode
4 switching contact
5 upper galvanic rectifier, cathodic
6 lower galvanic rectifier, cathodic
7 conductor to the upper anodes
8 conductor to the lower anodes
9 common current return conductor from the cathodes
10 clamp
11 slip rail
12 change-over switch
13 conductor partial inductance from the change over-switch to the electrolytic cell
14 conductor partial inductance from the galvanic rectifier to the change-over switch, cathodic
15 change-over switch input, cathodic
16 change-over switch input, anodic
17 conductor partial inductance from the galvanic rectifier to the change-over switch, anodic
18 change-over switch output
19 current conductor terminal
20 capacitor, cathodic
21 capacitor, anodic
22 overriding control system
23 switch, cathodic
24 switch, anodic
25 protective diode $D_k$
26 protective diode $D_a$
27 current sensor, cathodic
28 current sensor, anodic
31 current sensor, bipolar
32 upper galvanic rectifier, anodic
33 first electric line
34 second electric line, anodic
36 second electric line, cathodic

What is claimed is:

1. A circuit arrangement for supplying pulse current to one or more electrolytic cells, connected in parallel and having anodes and cathodes, in vertical or horizontal electroplating or etching systems, in which, to supply power to each individual electrolytic cell,
   a. at least one galvanic rectifier; and
   b. at least one change-over switch, which can be switched through from at least two inputs to at least one output, or one on/off switch are provided;
   c. first electric lines for making a direct electrical connection between respectively one terminal of the rectifiers and the one terminal of the electrolytic cell are provided;
   d. second electric lines for making a direct electrical connection between the respective other outputs of the rectifiers and the inputs of the change-over switches or a terminal of the on/off switch being provided; and in addition
   e. the at least one output of the change-over switches or the other terminal of the on/off switch being directly connected with the other terminal of the electrolytic cell, characterized in that at least one capacitor is connected between said first electric line and each second electric line.

2. Circuit arrangement according to claim 1, characterized in that both the change-over switch and the on/off switch and the capacitors are arranged in spatial proximity to the electrolytic cell, such that the inductance of the current conductors connecting the electrolytic cell and the change-over and on/off switches is minimized.

3. Circuit arrangement according to claims 1 or 2, characterized in that two rectifiers are provided with which a plurality of electrolytic cells which are connected in parallel may be commonly supplied with current, wherein a plurality of circuits, respectively, comprise common capacitors or to supply the electrolytic cells.

4. Circuit arrangement according to claims 1 or 2, characterized in that electronic switches are provided as change-over or on/off switches to generate a pulse sequence.

5. Circuit arrangement according to 1 or 2, characterized in that the change-over or on/off switches are each equipped with a current sensor, the measuring signal of which may be used for excess current disconnection to protect the switches.

6. Circuit arrangement according to claim 5, characterized in that an overriding control system is provided to monitor and regulate the electroplating and etching system, and to which the measuring signal of each current sensor may be transmitted.

7. Circuit arrangement according to 1 or 2 characterized in that the changeover and on/off witches are so configured that they can be triggered by means of electric control signals.

8. Circuit arrangement according to 1 or 2 characterized in that diodes are connected in parallel to the change-over and on/off switches and are of such polarity that energy originating during opening the switches can be absorbed by the capacitors without any danger of damages for the switches.

9. A method for supplying pulse current to any one or more electrolytic cells, connected in parallel and having anodes and cathodes, in vertical or horizontal electroplating or etching systems, comprising a circuit arrangement with
   a. at least two galvanic rectifiers; and
   b. at least one change-over switch which may be switched through from at least two inputs to at least one output; wherein for the power supply of each electrolytic cell are provided,
   c. first electric lines for a direct electrical connection, respectively, between one terminal of said rectifiers and one terminal of said electrolytic cell;
   d. second electric lines for a direct electrical connection, respectively, between the other outputs of the rectifiers and the inputs of the change-over switches; and in addition
   e. the respective at least one output of the change-over switches being directly connected with the other terminal of the electrolytic cell; and
   f. respectively at least one capacitor being connected between the first electric line and the second electric lines,
   with the following process steps:
   A. In a time interval $t_1$:
      a. feeding the electrolytic cell by connecting a first rectifier to the cell via a second electric line and at least one change-over switch; and
      b. simultaneous partial discharging of the at least one capacitor which is connected to the first rectifier via one of the second electric lines;
      c. charging of the capacitors which are connected with the other rectifiers via the remaining second electric lines;
   B. In a time interval $t_2$:
      d. feeding the electrolytic cell by connecting a second rectifier to the cell via a second electric line and at least one change-over switch; and
      e. simultaneous partial discharging of the at least one capacitor which is connected to the second rectifier via another of the second electric lines;
      f. charging the capacitors which are connected to the remaining rectifiers via the remaining second electric lines.

10. A method for supplying pulse current to one or more electrolytic cells, connected in parallel and having anodes and cathodes, in vertical or horizontal electroplating or etching systems, comprising a circuit arrangement with
    a. at least one galvanic rectifier; and
    b. at least one on/off switch with two terminals; wherein for the power supply of each electrolytic cell are provided
    c. a first electric line for a direct electrical connection between one terminal of the at least one rectifier and the one terminal of the electrolytic cell;
    d. a second electric line for a direct electrical connection between the other output of the at least one rectifier and the one terminal of the on/off switch; and in addition
    e. the other terminal of the on/off switch being directly connected to the other terminal of the electrolytic cell; and wherein
    f. furthermore, at least one capacitor being connected between the first electric line and the second electric line,
    with the following process steps:
    A. In a time interval $t_1$:
       a. feeding the electrolytic cell by connecting the at least one rectifier to the cell via the second electric line and the on/off switch; and
       b. simultaneous partial discharging of the at least one capacitor;
    B. In a time interval $t_2$:
       c. interrupting the connection between the electrolytic cell and the at least one rectifier by means of the on/off switch; and
       d. charging of the at least one capacitor.

11. Method according to any one of claims 9 and 10 characterized in that the anodic and cathodic amplitudes of the pulsed bath currents flowing through the electrolytic cell at a given ratio of $t_1$ to $t_2$ are adjusted by adjusting the anodic rectifier current $I_a$ for the anodic amplitude and/or the cathodic rectifier current $I_k$ for the cathodic amplitude.

12. Method according to any one of claims 9 to 10, characterized in that the amplitudes of the bath pulse currents flowing through the electrolytic cells are controlled by measuring the amplitude values and comparing these values with desired values by setting the rectifier current to constant values.

13. Method according to claim 9 characterized in that the change-over switches are triggered in such a way that it is not possible with said switches simultaneously to connect a plurality of rectifiers to one electrolytic cell.

14. Method according to any one of claims 9 to 10, characterized in that the change-over switches are triggered such that between the time intervals $t_1$ and $t_2$ in a time interval $t_{zero}>0$, all the connections between the rectifiers and the electrolytic cell are interrupted.

15. Method according to any one of claims 9 to 10, characterized in that in one group of electrolytic cells in an electroplating or etching system, a first periodic current pulse sequence is generated, and in another group of electrolytic cells a second periodic current pulse sequence is generated with a phase shift in relation to the first pulse sequence.

16. Method according to any one of claims 9 to 10, characterized in that the bath pulse current in an electrolytic cell is interrupted by the change-over switches if a printed circuit board is led into or out of this electrolytic cell.

17. Method according to any one of claims 9 to 10, characterized in that measuring signals for excess current disconnection being detected by means of suitable current sensors at said change-over switches or on/off switches are transmitted to a higher-level control to monitor the electroplating or etching system.

18. Method according to any one of claims 9 to 10, characterised in that the time intervals $t_1$ or $t_2$ in at least a portion of the electrolytic cells are set to be such that the bath current acts as direct current.

* * * * *

UNITED STATES PATENT AND TRADEMARK OFFICE
CERTIFICATE OF CORRECTION

PATENT NO.   : 6,179,984 B1
DATED        : January 30, 2001
INVENTOR(S)  : Manfred Maurer It is certified that error appears in the above-identified patent and that said Letters Patent is hereby corrected as shown below:

Column 6,
Line 7, delete "lecels", and insert -- levels -- in its place.

Column 12,
Line 66, after "according to" insert -- claims --.

Column 13,
Line 8, after "according to" insert -- claims --.
Line 9, delete "witches", and insert -- switches -- in its place.
Line 12, after "according to" insert -- claims --.

Signed and Sealed this

Twenty-third Day of October, 2001

Attest:

NICHOLAS P. GODICI
Attesting Officer
Acting Director of the United States Patent and Trademark Office